United States Patent
Chuang et al.

(10) Patent No.: US 9,503,043 B2
(45) Date of Patent: Nov. 22, 2016

(54) DUPLEXER, CIRCUIT STRUCTURE THEREOF AND RF TRANSCEIVER APPARATUS COMPRISING THE DUPLEXER

(71) Applicant: Siliconware Precision Industries Co., Ltd., Taichung (TW)

(72) Inventors: Min-Han Chuang, Taichung (TW); Chia-Chu Lai, Taichung (TW); Bo-Shiang Fang, Taichung (TW); Ho-Chuan Lin, Taichung (TW); Yen-Yu Chen, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 469 days.

(21) Appl. No.: 13/875,550

(22) Filed: May 2, 2013

(65) Prior Publication Data

US 2014/0204806 A1 Jul. 24, 2014

(30) Foreign Application Priority Data

Jan. 18, 2013 (TW) .............................. 102101933 A

(51) Int. Cl.
*H03H 7/46* (2006.01)
*H03H 7/09* (2006.01)
*H03H 7/01* (2006.01)
*H03H 1/00* (2006.01)

(52) U.S. Cl.
CPC ............... *H03H 7/463* (2013.01); *H03H 7/09* (2013.01); *H03H 7/1775* (2013.01); *H03H 7/1783* (2013.01); *H03H 2001/0064* (2013.01); *H03H 2001/0078* (2013.01)

(58) Field of Classification Search
CPC .................... H03H 7/463; H03H 7/468; H03H 7/0115; H03H 7/09; H03H 2001/0085; H03H 7/1775

USPC ........................................ 333/132, 175, 185
See application file for complete search history.

(56) References Cited

U.S. PATENT DOCUMENTS

| 3,806,813 | A | * | 4/1974 | Eller ........................ H03H 7/01 348/E7.069 |
| 6,411,178 | B1 | * | 6/2002 | Matsumura .......... H03H 7/0115 333/134 |
| 2006/0145782 | A1 | * | 7/2006 | Liu ......................... H03H 7/463 333/132 |
| 2010/0171565 | A1 | * | 7/2010 | Okada .................... H03H 7/463 333/132 |
| 2011/0010749 | A1 | * | 1/2011 | Alkan ........................... 725/127 |
| 2013/0241669 | A1 | * | 9/2013 | Mikhemar et al. ........... 333/126 |

* cited by examiner

*Primary Examiner* — Robert Pascal
*Assistant Examiner* — Rakesh Patel
(74) *Attorney, Agent, or Firm* — Mintz Levin Cohn Ferris Glovsky and Popeo, P.C.; Peter F. Corless; Steven M. Jensen

(57) ABSTRACT

A duplexer is provided, which includes a first, a second and a third signal ports; a first filter and a second filter. The first filter has first, second, and third resonant circuits that have first, second and third inductors, respectively. The first, second and third inductors are mutually inductive. The first and third resonant circuits are electrically connected to the first and second signal ports, respectively. The second filter has fourth, fifth and sixth resonant circuits that have fourth, fifth and sixth inductors, respectively. The fourth resonant circuit is connected in series with the first resonant circuit. The fifth inductor and the fourth inductor are mutually inductive. The sixth resonant circuit is electrically connected to the third signal port. The second filter further has a main capacitor connected in series with the fifth and sixth resonant circuits respectively and located therebetween.

29 Claims, 14 Drawing Sheets

DUPLEXER, CIRCUIT STRUCTURE THEREOF AND RF TRANSCEIVER APPARATUS COMPRISING THE DUPLEXER

CROSS-REFERENCES TO RELATED APPLICATIONS

This application claims under 35 U.S.C. §119(a) the benefit of Taiwanese Application No. 102101933, filed Jan. 18, 2013, the entire contents of which is incorporated herein by reference.

BACKGROUND OF THE INVENTION

1. Field of the Invention

The present invention relates to duplexers, and more particularly, to a duplexer having a frequency discrimination capability, a circuit structure of the duplexer and an RF (radio frequency) transceiver apparatus comprising the duplexer.

2. Description of Related Art

In current wireless communication systems, RF (radio frequency) apparatus are required to operate under multiple frequency bands. For example, duplexers are indispensable elements of multi-band communication systems and multiplex systems. A duplex has three ports. One of them is an input port and the other two are output ports for separating signals at different frequencies. Alternatively, two of the three ports are input ports and the other one is an output port for integrating signals at different frequencies.

FIGS. 1 and 1' are respectively a schematic circuit diagram and a circuit layout diagram of a conventional duplexer 1.

Referring to FIGS. 1 and 1', the duplexer 1 has a circuit structure 1' formed on a substrate 1a. The duplexer 1 has: a first signal port 17; a first filter 10a electrically connected to the first signal port 17 through a first resonant circuit 11; a second signal port 18a electrically connected to the first filter 10a; a second filter 10b electrically connected to the first signal port 17 through a fourth resonant circuit 14; a third signal port 18b electrically connected to the second filter 10b through a fourth resonant circuit 14; and ground ports 19. The first filter 10a has a second resonant circuit 12 and a third resonant circuit 13 and a main capacitor 100. The second filter 10b has a fifth resonant circuit 15, a sixth resonant circuit 16 and a main inductor 101. The ground ports 19 are connected to the second resonant circuit 12 and the fifth resonant circuit 15, respectively.

The first resonant circuit 11 has a first inductor L1 connected in parallel with a first capacitor C1 and electrically connected to the first signal port 17.

The second resonant circuit 12 has a second inductor L2 connected in parallel with a second capacitor C2 and electrically connected to the first resonant circuit 11 in series.

The third resonant circuit 13 has a third inductor L3 connected in parallel with a third capacitor C3 and electrically connected to the second signal port 18a.

The main capacitor 100 is connected in series with the second and third resonant circuits 12, 13 and located therebetween.

The fourth resonant circuit 14 has a fourth inductor L4 connected in parallel with a fourth capacitor C4 and electrically connected to the first signal port 17.

The fifth resonant circuit 15 has a fifth inductor L5 connected in parallel with a fifth capacitor C5 and electrically connected to the fourth resonant circuit 14 in series.

The sixth resonant circuit 16 has a sixth inductor L6 connected in parallel with a sixth capacitor C6 and electrically connected to the third signal port 18b.

The main inductor 101 is connected in series with the fifth and sixth resonant circuits 15, 16 and located therebetween.

In the duplexer 1 of FIG. 1, the inductors and capacitors have inductances and capacitances as follows.

| Capacitor | Capacitance | Inductor | Inductance |
| --- | --- | --- | --- |
| C1 | 0.7015 pF | L1 | 1.1224 nH |
| C2 | 3.8487 pF | L2 | 1.1787 nH |
| C3 | 2.9604 pF | L3 | 2.9604 nH |
| C4 | 1.6818 pF | L4 | 2.6941 nH |
| C5 | 1.403 pF | L5 | 0.5612 nH |
| C6 | 0.8684 pF | L6 | 0.5786 nH |
| Main capacitor 100 | 0.5787 pF | Main inductor 101 | 2.5465 nH |

Generally, a full lumped element method is used for the design of the duplexer 1 and accordingly two electrical matching networks and two filters 10a, 10b are needed to separate signals at different frequencies sent from the first signal ports 17, and the separated signals are further transmitted through the second and third signal ports 18a, 18b, respectively. The two electrical matching networks are the first and fourth resonant circuits 11, 14.

To achieve the above-described design of the duplexer 1, the first, second, third, fourth, fifth, and sixth resonant circuits from 11 to 16, the main inductor 101 and the main capacitor 100 need to be formed on a same surface of the substrate 1a. As such, a large sure area of the substrate 1a is occupied by the circuit structure 1' of the duplexer 1, thus hindering miniaturization of the semiconductor element.

Further, since signals from the first signal port 17 are transmitted into the first and fourth resonant circuits 11, 14, respectively, it results in a poor frequency discrimination capability for the duplexer 1, which will be described later.

Therefore, how to overcome the above-described disadvantages has become urgent.

SUMMARY OF THE INVENTION

In view of the above-described disadvantages, the present invention provides a circuit structure of a duplexer, which comprises a first circuit layer and a second circuit layer formed on the first circuit layer. The first circuit layer comprises: a main capacitor; a first, a second, a third, a fourth, a fifth, and a sixth capacitors; a second inductor connected in parallel with the second capacitor so as to form a second resonant circuit; and a first half inductor. The second circuit layer comprises: a first inductor connected in parallel with the first capacitor so as to form a first resonant circuit, wherein the first inductor and the second inductor are mutually inductive; a third inductor connected in parallel with the third capacitor so as to form a third resonant circuit, wherein the third inductor and the second inductor are mutually inductive, and the first, second and third resonant circuits form a first filter; a fourth inductor connected in parallel with the fourth capacitor so as to form a fourth resonant circuit, wherein the fourth resonant circuit is connected in series with the first resonant circuit; a second half inductor connected in series with the first half inductor such that the first half inductor and the second half inductor form a fifth inductor, wherein the fifth inductor is connected in parallel with the fifth capacitor so as to form a fifth resonant circuit, and the fifth inductor and the fourth inductor are mutually inductive; a sixth inductor connected in parallel with the sixth capacitor so as to form a sixth resonant circuit, wherein the sixth resonant circuit, the main capacitor, and the fifth resonant circuit are connected in series, and the fourth to sixth resonant circuits form a second filter; a first signal port electrically connected to the first resonant circuit; a second signal port electrically connected to the third resonant circuit; and a third signal port electrically connected to the sixth resonant circuit.

In the above-described circuit structure, the second inductor can be larger in size than the first inductor.

In the above-described circuit structure, the second inductor can be larger in size than the third inductor.

The above-described circuit structure can further comprise a plurality of conductive vias formed in the first circuit layer for electrically connecting the first inductor to the first capacitor, the third inductor to the third capacitor, the fourth inductor to the fourth capacitor, the first to second half inductors, the second half inductor to the fifth capacitor, and the sixth inductor to the sixth capacitor, respectively.

The above-described circuit structure can further comprise a substrate so as for the first circuit layer to be formed thereon. The substrate has a plurality of electrodes respectively corresponding to the main capacitor and the first, second, third, fourth, fifth, and sixth capacitors. The above-described circuit structure can further comprise a plurality of conductive through holes penetrating the substrate and the first circuit layer for electrically connecting the first inductor, the third inductor, the fourth inductor and the second half inductor to the corresponding electrodes, respectively.

The present invention further provides a duplexer, which comprises: a first signal port; a second signal port; a third signal port; a first filter; and a second filter. The first filter comprises: a first resonant circuit electrically connected to the first signal port and having a first inductor connected in parallel with a first capacitor; a second resonant circuit having a second inductor connected in parallel with a second capacitor, wherein the first inductor and the second inductor are mutually inductive; and a third resonant circuit electrically connected to the second signal port and having a third inductor connected in parallel with a third capacitor, wherein the third inductor and the second inductor are mutually inductive. The second filter comprises: a fourth resonant circuit connected in series with the first resonant circuit and having a fourth inductor connected in parallel with a fourth capacitor; a fifth resonant circuit having a fifth inductor connected in parallel with a fifth capacitor, wherein the fifth inductor and the fourth inductor are mutually inductive; a sixth resonant circuit electrically connected to the third signal port and having a sixth inductor connected in parallel with a sixth capacitor; and a main capacitor connected in series with between the fifth resonant circuit and the sixth resonant circuit.

In the above-described duplexer, the fifth inductor can be made of a first half inductor connected in series with a second half inductor.

In the above-described duplexer and the circuit structure thereof, the first inductor and the third inductor can be mutually inductive.

In the above-described duplexer and the circuit structure thereof, the main capacitor can be comprised of two capacitors connected in series. One of the two capacitors is connected in series with the fifth resonant circuit and the other capacitor is connected in series with the sixth resonant circuit.

In the above-described duplexer and the circuit structure thereof, the first signal port can be an input port, and the second and third signal ports can be output ports.

In the above-described duplexer and the circuit structure thereof, the first signal port can be an output port, and the second and third signal ports can be input ports.

The above-described duplexer and the circuit structure thereof can further comprise a plurality of ground ports connected to the third, fourth, and fifth resonant circuits, respectively.

The present invention further provides an RF (radio frequency) transceiver apparatus used in a wireless communication system for transmitting and receiving a first band signal corresponding to a first center frequency and a second band signal corresponding to a second center frequency. The apparatus comprises: an antenna for transmitting and receiving the first and second band signals; a first processing unit for processing the first band signal; a second processing unit for processing the second band signal; and the above-described duplexer, wherein the first signal port is electrically connected to the antenna, the second signal port is electrically connected to the first processing unit, and the third signal port is electrically connected to the second processing unit.

In the above-described transceiver apparatus, the wireless communication system can be a wireless access point, a wireless router, a wireless network card, a third generation (3G) wireless communication system or a fourth generation (4G) wireless communication system.

Therefore, through the design of mutual induction between the inductors, the first signal port is only connected to the first resonant circuit and the fourth resonant circuit is further connected in series with the first resonant circuit. Consequently, the invention dispenses with the conventional two electrical matching networks and the main inductor. Further, by providing a stacked circuit structure so as for the capacitors and the inductors to be formed in different circuit layers thereof, the invention reduces the surface area of the substrate occupied by the circuit structure, thereby reducing the size of the semiconductor element.

Furthermore, the invention improves the frequency discrimination capability through the design of mutual induction.

BRIEF DESCRIPTION OF DRAWINGS

FIG. 1' is a circuit layout diagram of the conventional duplexer;

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "upper", "lower", "first", "second", "a" etc. are merely for illustrative purposes and should not be construed to limit the scope of the present invention.

Figure 1:
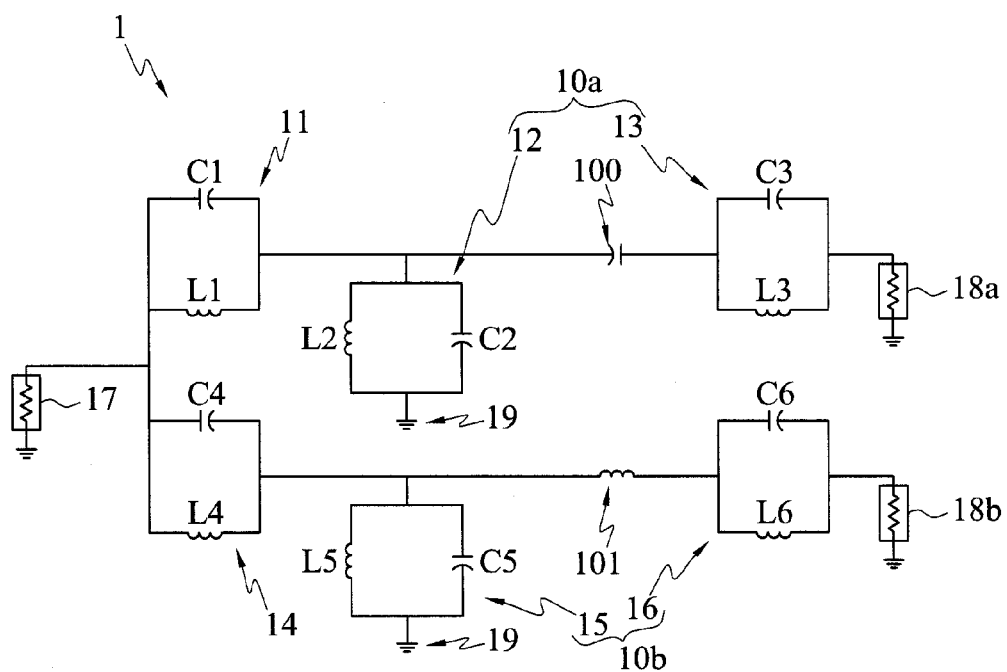
FIG. 1 is a schematic circuit diagram of a conventional duplexer.
Figure 1:
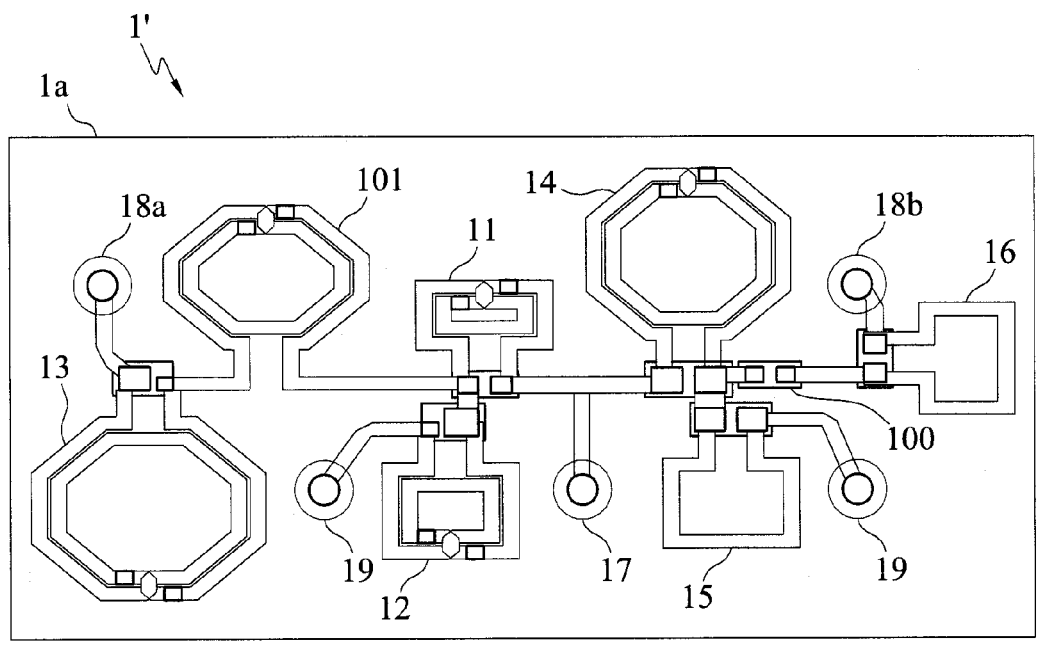
Figure 2:
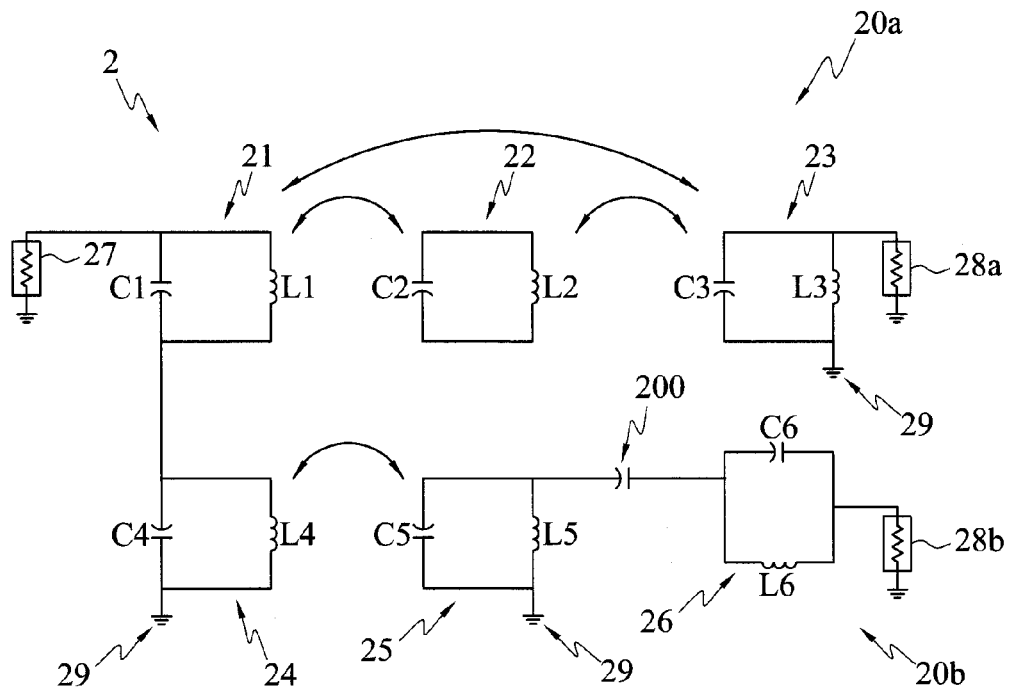
FIGS. 2 and 2' are schematic circuit diagrams of a duplexer according to different embodiments of the present invention.
Figure 2:
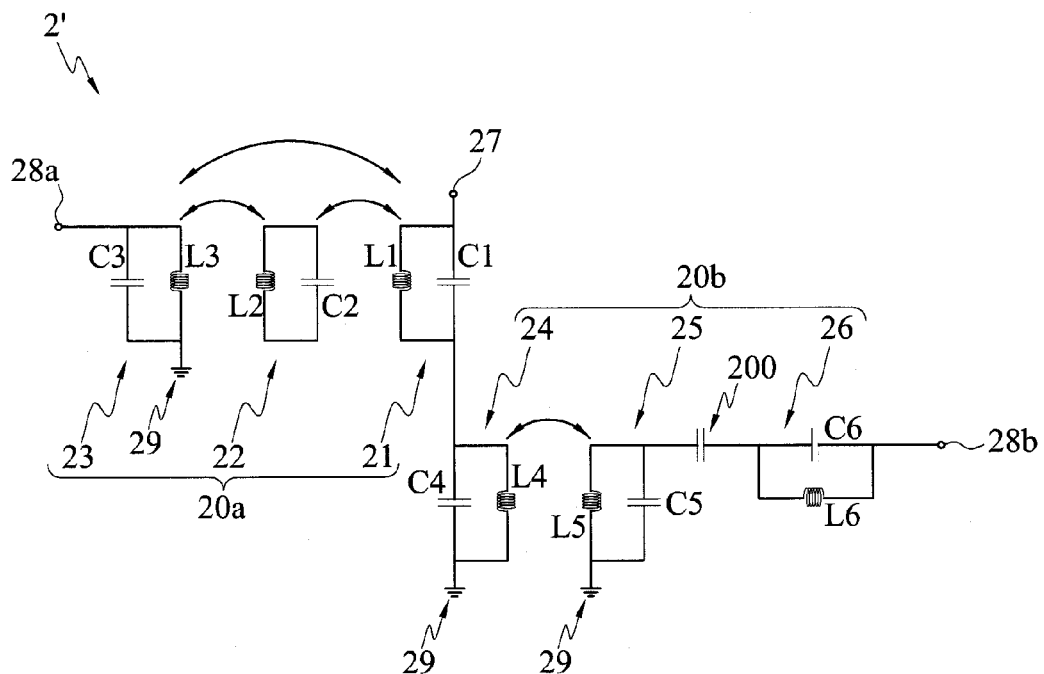

FIGS. 2 and 2' are schematic circuit diagrams showing a duplexer according to different embodiments of the present invention. Referring to FIGS. 2 and 2', the duplexer 2, 2' has: a first signal port 27; a first filter 20a electrically connected to the first signal port 27; a second signal port 28a electrically connected to the first filter 20a; a second filter 20b electrically connected to the first filter 20a; a third signal port 28b electrically connected to the second filter 20b; and ground ports 29. The first filter 20a has first, second and third resonant circuits 21, 22, 23. The second filter 20b has fourth, fifth and sixth resonant circuits 24, 25, 26 and a main capacitor 200. The ground ports 29 are connected to the third, fourth and fifth resonant circuits 23, 24, 25, respectively.

The first resonant circuit 21 has a first inductor L1 connected in parallel with a first capacitor C1 and electrically connected to the first signal port 27.

The second resonant circuit 22 has a second inductor L2 connected in parallel with a second capacitor C2, and the first inductor L1 and the second inductor L2 are mutually inductive.

The third resonant circuit 23 has a third inductor L3 connected in parallel with a third capacitor C3 and electrically connected to the second signal port 28a, and the third inductor L3 is in mutual induction with the first inductor L1 and the second inductor L2, respectively.

The fourth resonant circuit 24 has a fourth inductor L4 connected in parallel with a fourth capacitor C4 and electrically connected to the first resonant circuit 21 in series.

The fifth resonant circuit 25 has a fifth inductor L5 connected in parallel with a fifth capacitor C5, and the fifth inductor L5 and the fourth inductor L4 are mutually inductive.

The sixth resonant circuit 26 has a sixth inductor L6 connected in parallel with a sixth capacitor C6 and electrically connected to the third signal port 28b.

The main capacitor 200 is connected in series with the fifth and sixth resonant circuits 25, 26 respectively and located therebetween.

Mutual induction occurs when two inductors are placed close to each other. Through the design of mutual induction, the first signal port 27 is only connected to the first resonant circuit 21 and the fourth resonant circuit 24 is connected in series with the first resonant circuit 21, thus dispensing with the conventional two electrical matching networks and the conventional main inductor.

In the present embodiment, the first signal port 27 is an input port and the second and third signal ports 28a, 28b are output ports. In other embodiments, the first signal port 27 can be an output port and the second and third signal ports 28a, 28b can be input ports.

The capacitors and inductors of the duplexer 2 of FIG. 2 have capacitances and inductances as follows.

| Capacitor | Capacitance | Inductor | Inductance |
| --- | --- | --- | --- |
| C1 | 4.524 pF | L1 | 0.8678 nH |
| C2 | 3.38 pF | L2 | 1.3804 nH |
| C3 | 4.524 pF | L3 | 0.8678 nH |
| C4 | 1.637 pF | L4 | 0.5115 nH |
| C5 | 1.637 pF | L5 | 0.5115 nH |
| C6 | 0.8684 pF | L6 | 0.5786 nH |
| Main capacitor 200 | 0.5787 pF | | |

Figure 4:
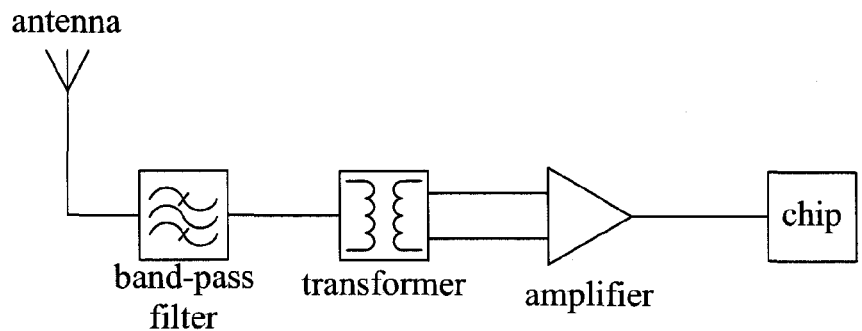
FIG. 4 is a diagram illustrating an operational mechanism of a filter.
Figure 4:
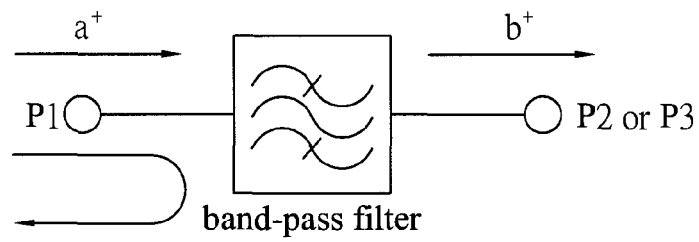
Figure 4:
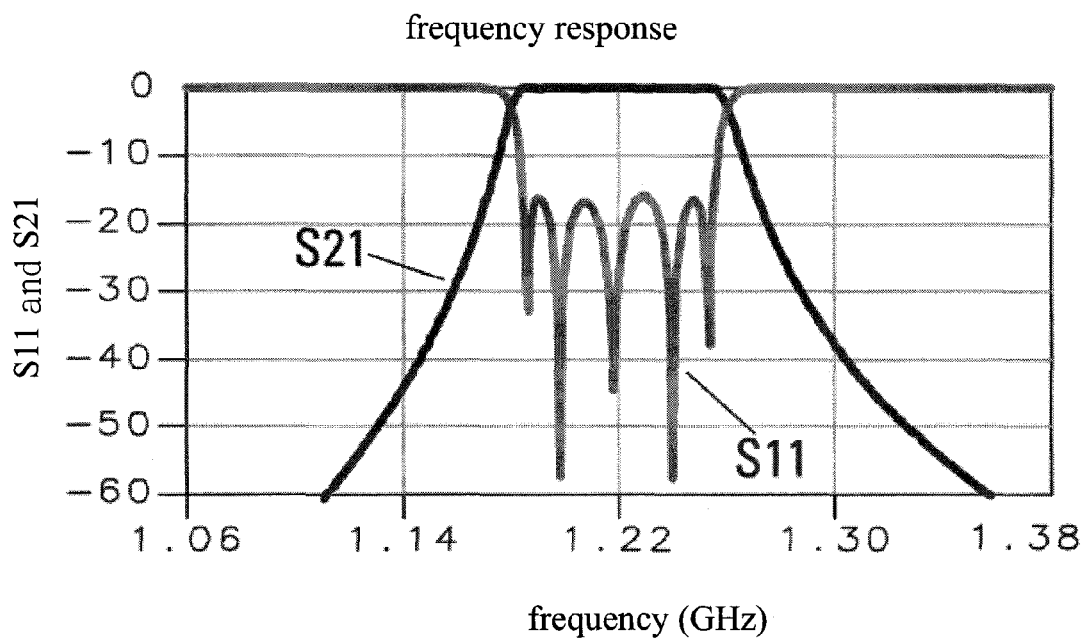

FIG. 4 shows an operational mechanism of a filter. For example, a frequency response of a band-pass filter is shown in FIG. 4. The band-pass filter has a signal input port P1 and a signal output port P2 or P3. A balanced-unbalanced (BALUN) transformer and a low noise amplifier (LNA) are provided. In FIG. 4, $a^+$ represents incident power, $a^-$ represents reflected power, $b^+$ represents transmitted power, S11 represents return loss, and S21 represents insertion loss. Therein, S11=10 log $[a^-/a^+]$ and S21=10 log $[b^-/a^+]$.

The design of the band-pass filter aims to provide a large return loss S11 and a small insertion loss S21 within the pass band. Referring to FIG. 4, the band-pass filter allows signals at frequencies within the pass band to pass easily while rejects signals at frequencies outside the pass band.

The duplexer 2, 2' has dual-band band-pass filters, i.e., the first and second filters 20a, 20b. Signals at frequencies within the two pass bands can be transmitted through the dual-band pass filters to the two output ports.

Figure 4A:
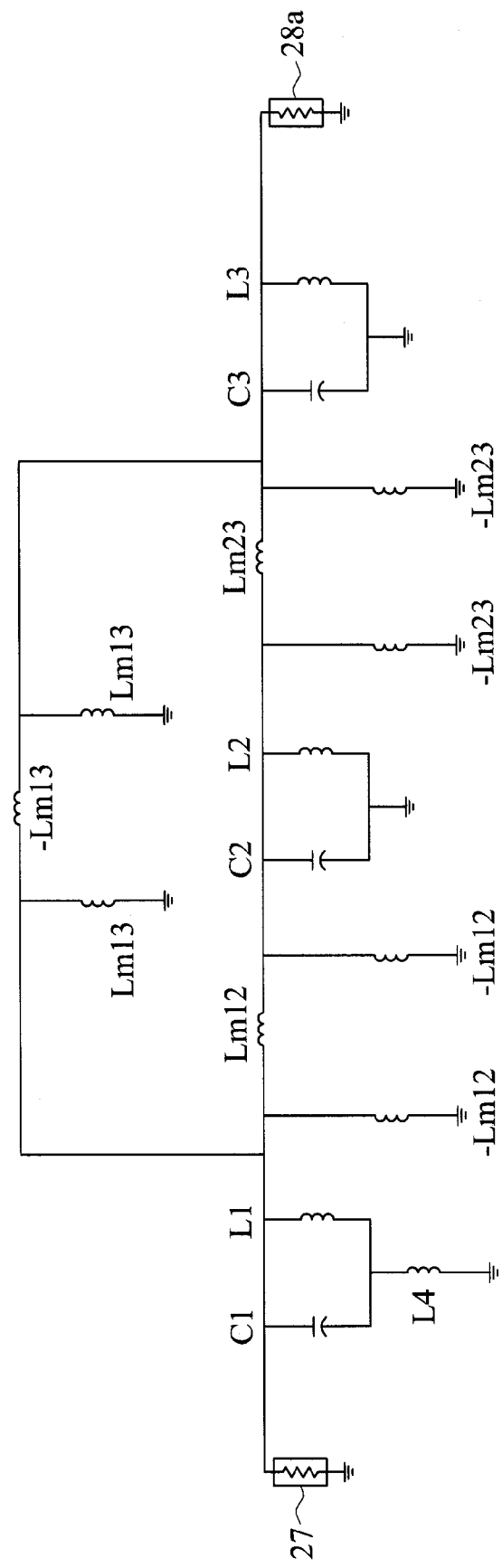
FIGS. 4A and 4B are schematic circuit diagrams illustrating operational mechanism of the duplexer at different frequencies according to the present invention.
Figure 4B:
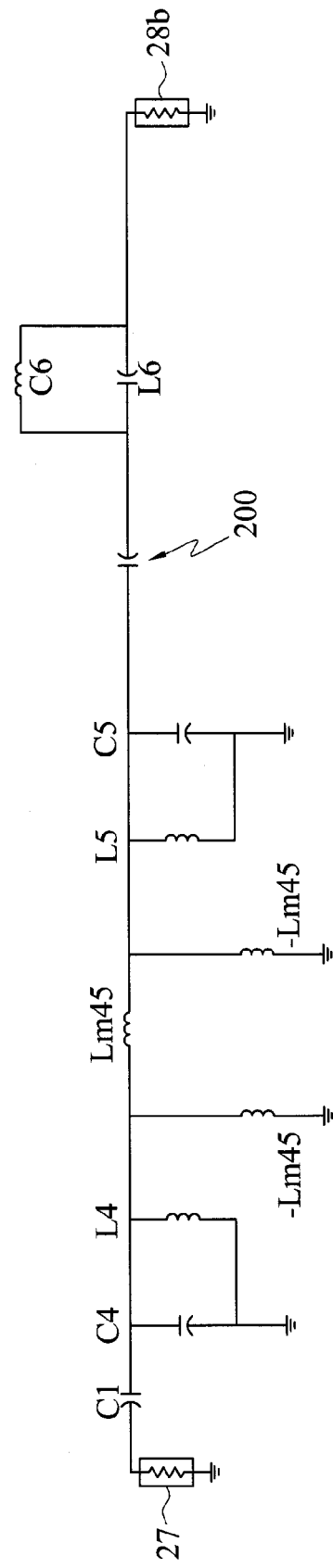

FIGS. 4A and 4B are schematic circuit diagrams showing operational mechanism of the duplexer 2.

FIG. 4A shows operational mechanism of the duplexer 2 at a frequency of 2.45 GHz. Referring to FIG. 4, $L_{m12}$ represents the mutual induction between the first inductor L1 and the second inductor L2. $L_{m13}$ represents the mutual induction between the first inductor L1 and the third inductor L3. $L_{m23}$ represents the mutual induction between the second inductor L2 and the third inductor L3. The capacitors and the inductors have capacitances and inductances as follows.

| Capacitor | Capacitance | Inductor | Inductance |
| --- | --- | --- | --- |
| C1 | 4.524 pF | L1 | 0.8678 nH |
| C2 | 3.38 pF | L2 | 1.3804 nH |
| C3 | 4.524 pF | L3 | 0.8678 nH |
| | | $L_{m12}$ | 0.3395 nH |

-continued

| Capacitor | Capacitance | Inductor | Inductance |
|---|---|---|---|
| | | $L_{m13}$ | 0.1323 nH |
| | | $L_{m23}$ | 0.3395 nH |
| | | L4 | 0.6381 nH |

FIG. 4B shows operational mechanism of the duplexer 2 at a frequency of 5.5 GHz. Referring to FIG. 4B, $L_{m45}$ represents the mutual induction between the fourth inductor L4 and the fifth inductor L5. The capacitors and inductors have capacitances and inductances as follows.

| Capacitor | Capacitance | Inductor | Inductance |
|---|---|---|---|
| C1 | 3.5591 pF | | |
| C4 | 1.637 pF | L4 | 0.5115 nH |
| C5 | 1.637 pF | L5 | 0.5115 nH |
| C6 | 0.8684 pF | L6 | 0.5786 nH |
| Main capacitor 200 | 0.5787 pF | $L_{m45}$ | 0.1808 nH |

It should be noted that the duplexer 2, 2' can be designed to receive and transmit any two different frequencies without being limited to the above-described frequencies of 2.45 GHz and 5.5 GHz.

FIGS. 5A and 5B, 6A and 6B compare the actual performances of the conventional duplexer 1 with the duplexer 2 of the present invention. Therein, S11, S11' represent return losses, S21, S21' represent insertion losses from the first signal ports 17, 27 to the second signal ports 18a, 28a, and S31, S31' represent insertion losses from the first signal ports 17, 27 to the third signal ports 18b, 28b.

Figure 5A:
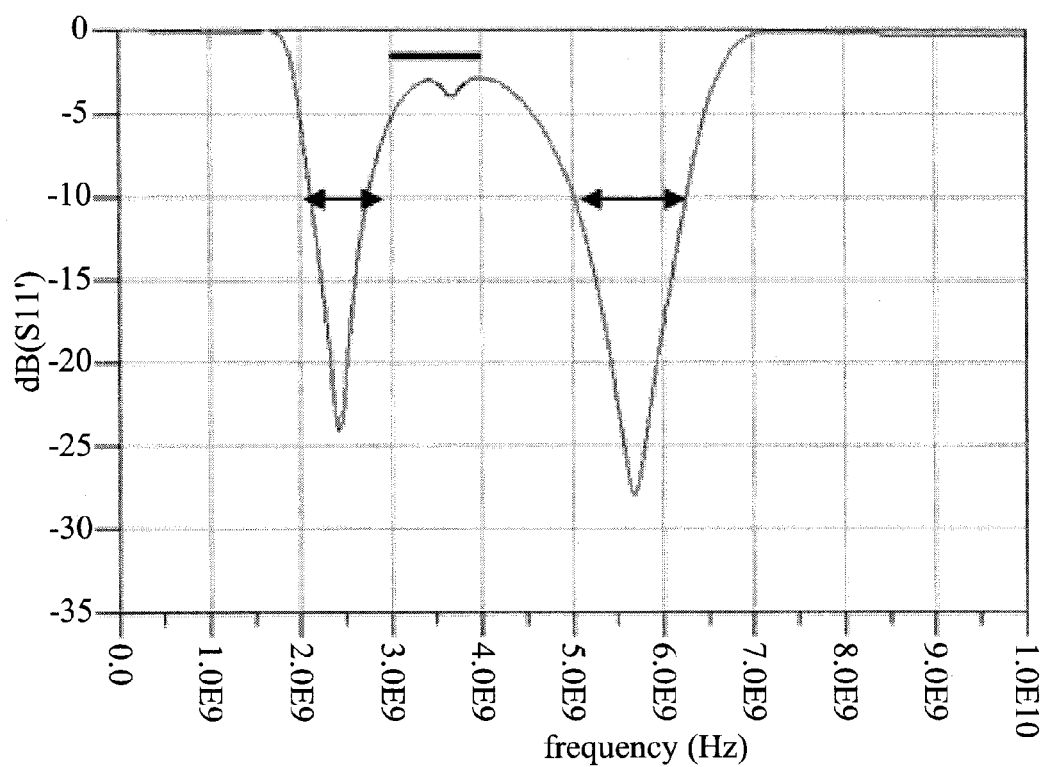
FIG. 5A is a graph showing the relationship between return loss and frequency of the conventional duplexer.
Figure 5B:
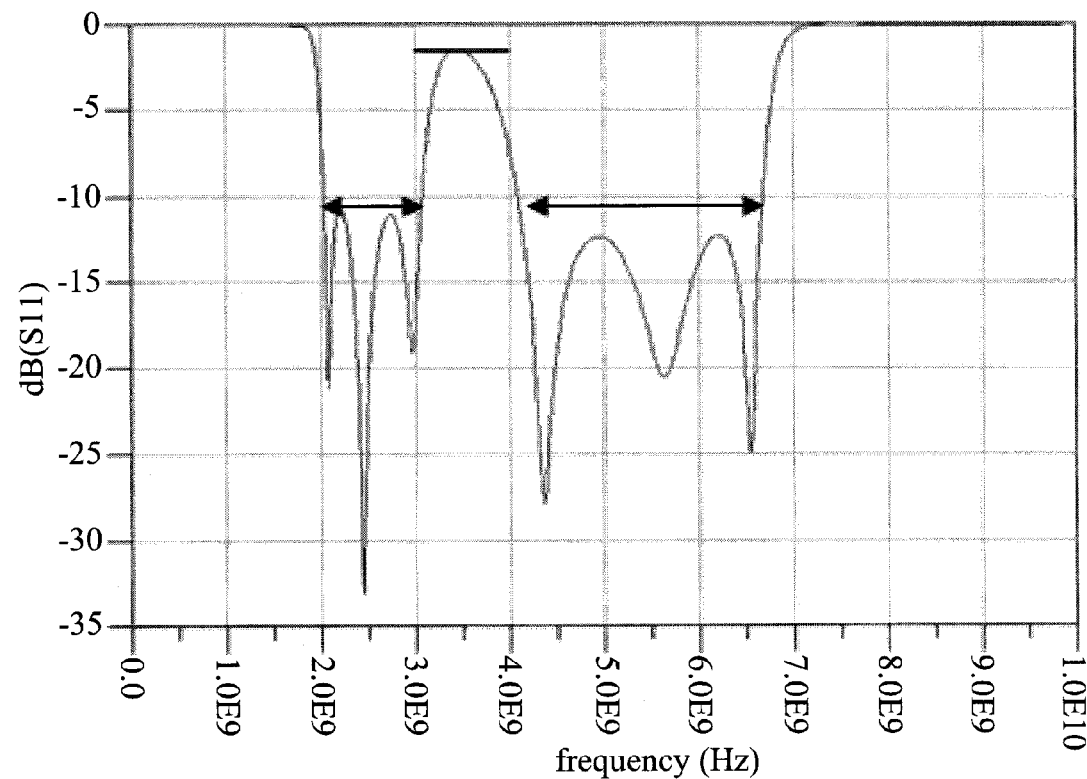
FIG. 5B is a graph showing the relationship between return loss and frequency of the duplexer of the present invention.

FIG. 5A shows the relationship between return loss S11' and frequency of the conventional duplexer 1, and FIG. 5B shows the relationship between return loss S11 and frequency of the duplexer 2.

Referring to FIGS. 5A and 5B, the duplexer 2 has more obvious dual bands (i.e., the curve is steeper) and larger return loss S11, and the duplexer 1 has smaller return loss S11' or narrower bands and less obvious bands (i.e., the curve is flatter).

Figure 6A:
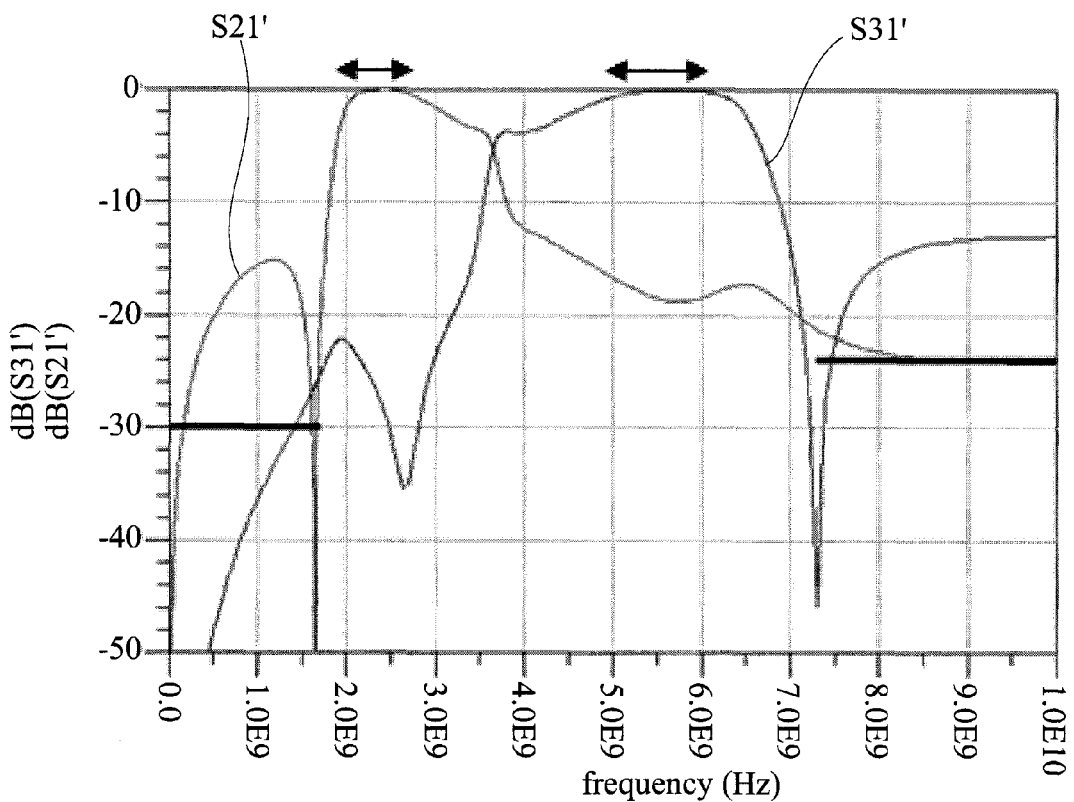
FIG. 6A is a graph showing the relationship between insertion loss and frequency of the conventional duplexer.
Figure 6B:
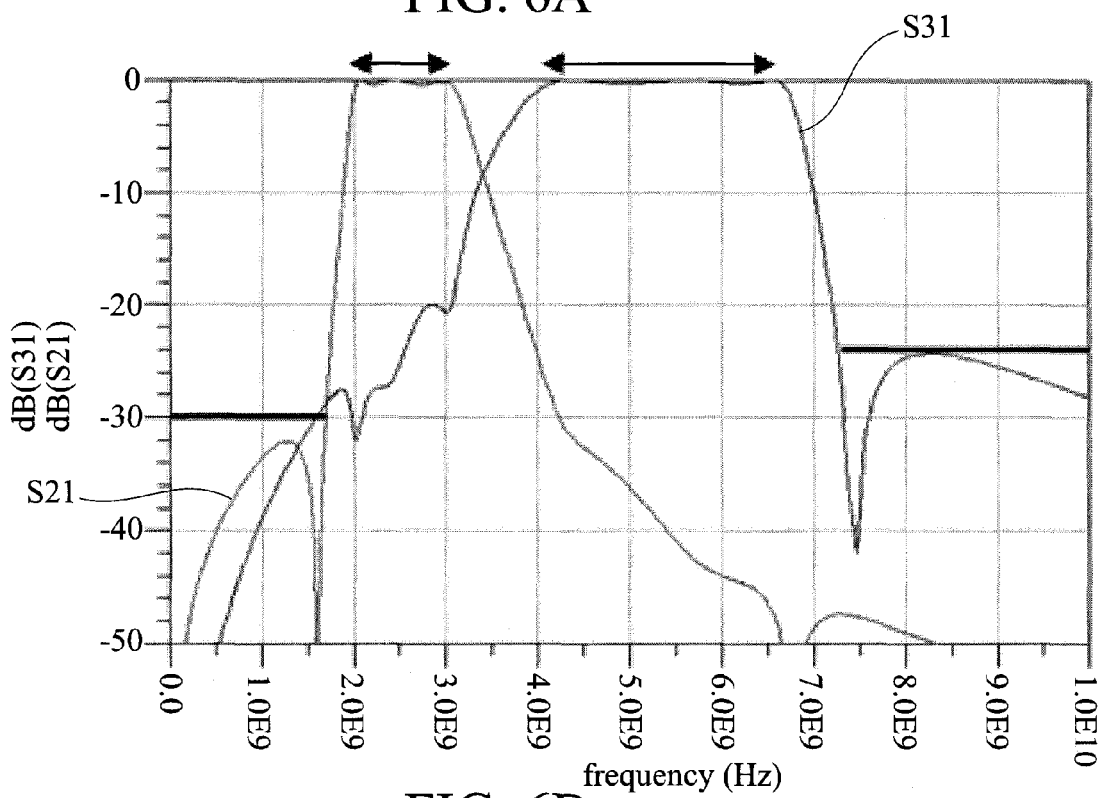
FIG. 6B is a graph showing the relationship between insertion loss and frequency of the duplexer of the present invention.

FIG. 6A shows the relationship between insertion losses S21', S31' and frequency of the conventional duplexer 1. FIG. 6B shows the relationship between insertion losses S21, S31 and frequency of the duplexer 2 of the present invention.

Referring to FIGS. 6A and 6B, the duplexer 2 has more obvious or wider dual bands and smaller insertion losses S21, S31, and the duplexer 1 has larger insertion losses S21', S31' and less obvious or narrower bands.

Therefore, compared with the prior art, the duplexer 2, 2' has more obvious dual bands and a better frequency discrimination capability.

Figure 3A:
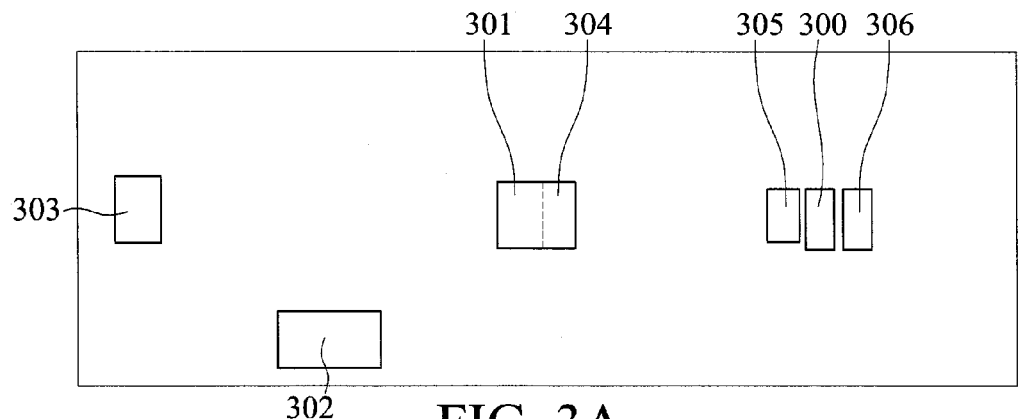
FIGS. 3A to 3D are circuit layout diagrams illustrating a fabrication method of a circuit structure of the duplexer according to the present invention, wherein FIG. 3B' illustrates different layers of the layout of FIG. 3B, FIG. 3C' illustrates different layers of the layout of FIG. 3C, and FIG. 3D' is a partially cross-sectional view of the layout of FIG. 3D.
Figure 3B:
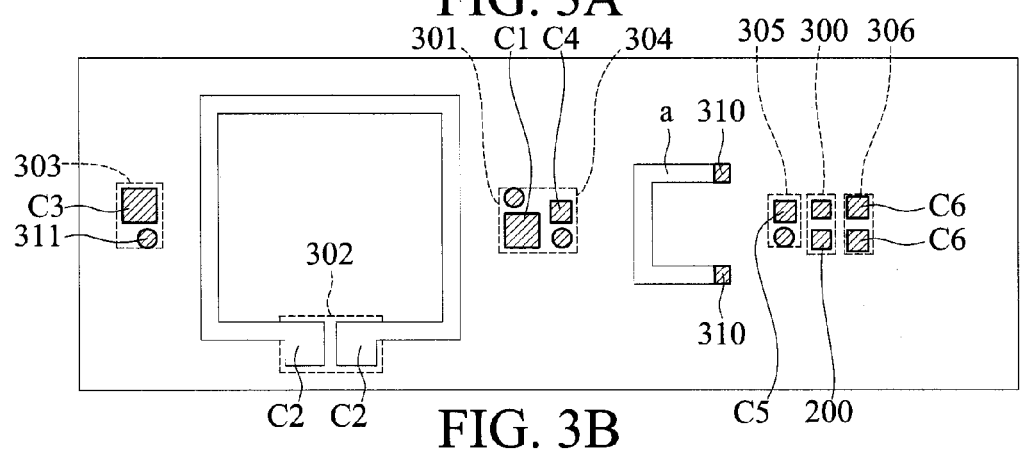
Figure 3B:
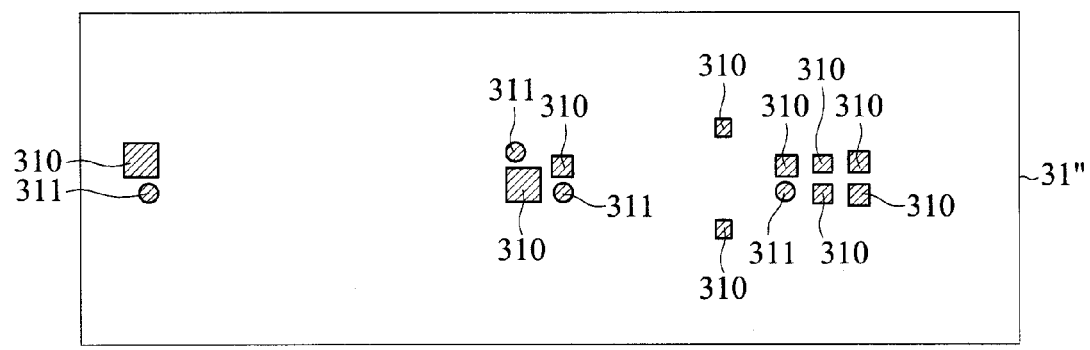
Figure 3B:
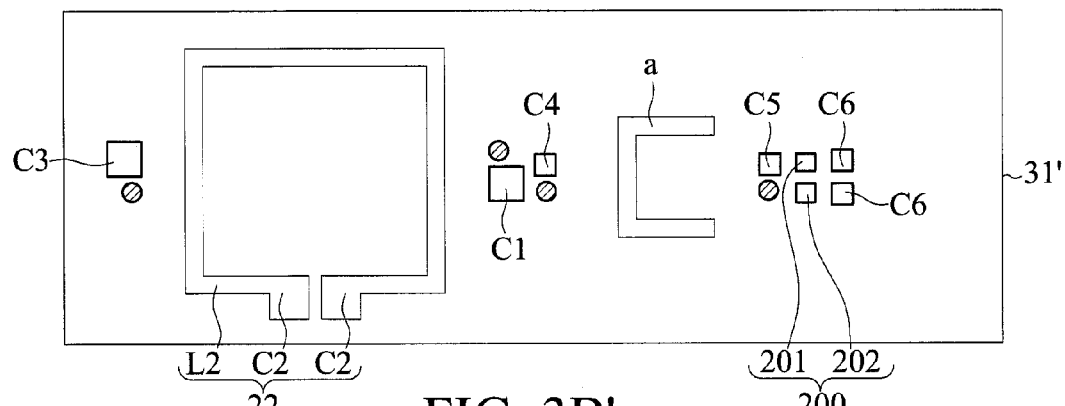
Figure 3C:
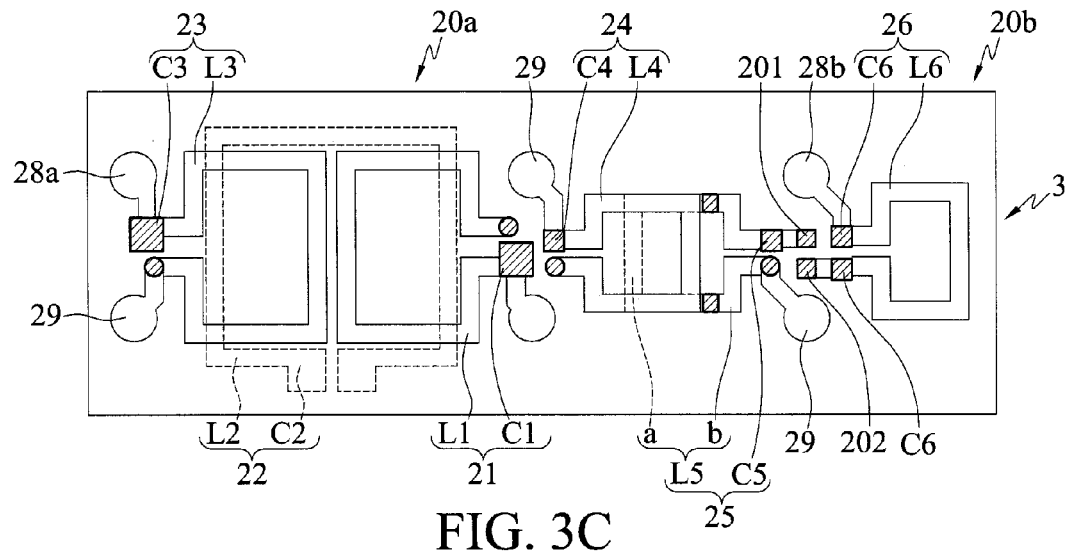
Figure 3C:
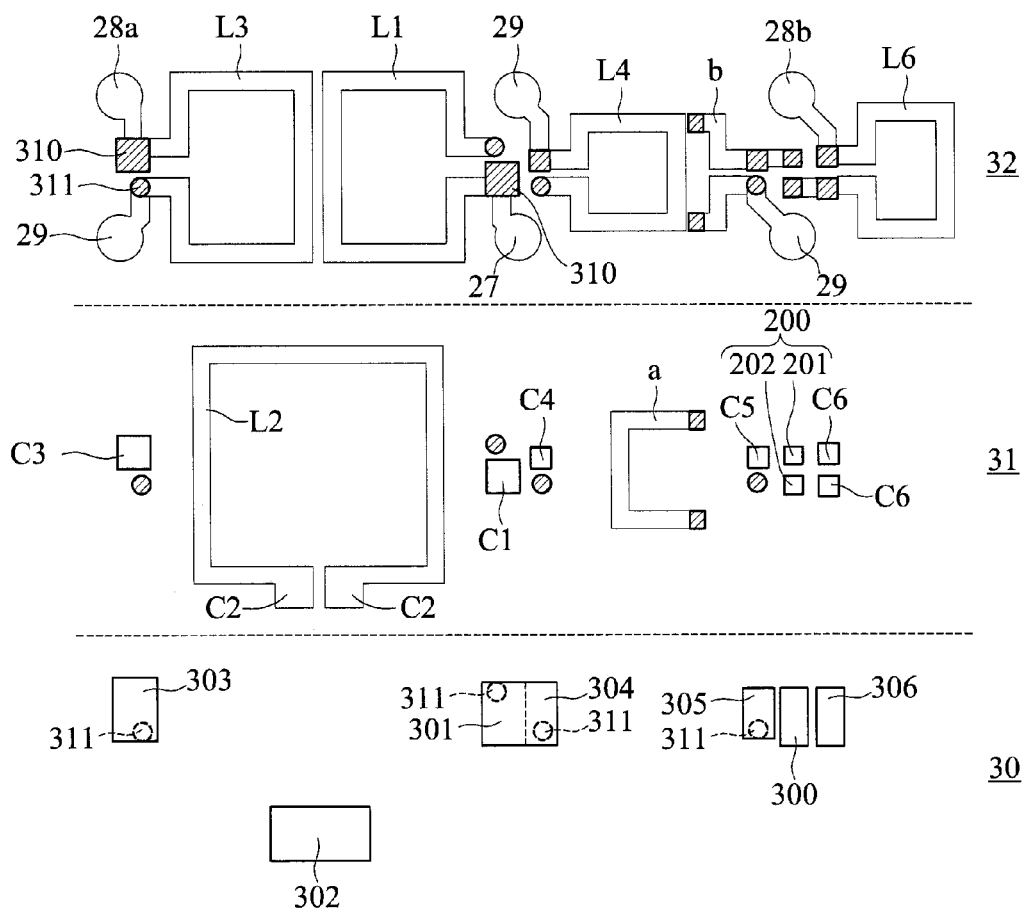
Figure 3D:
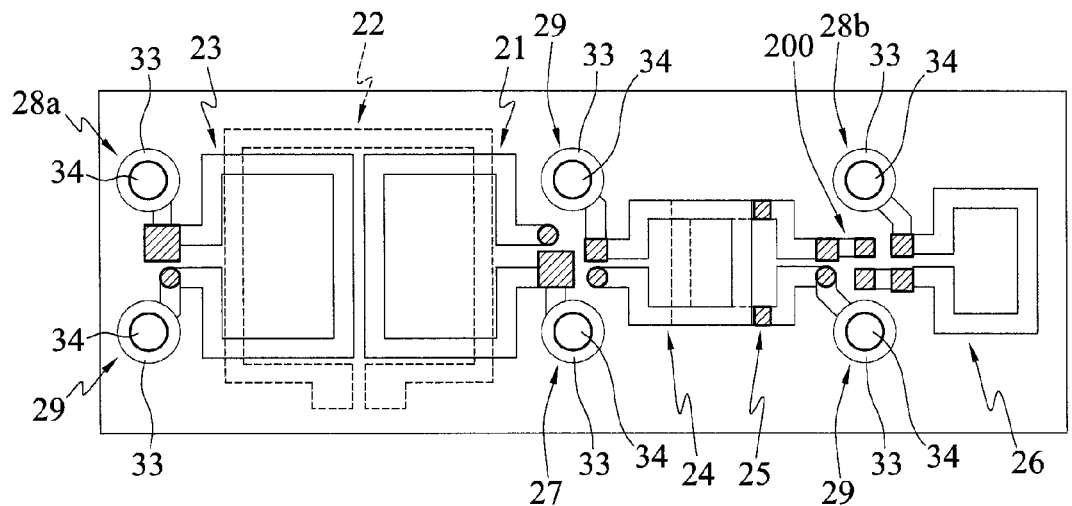
Figure 3D:
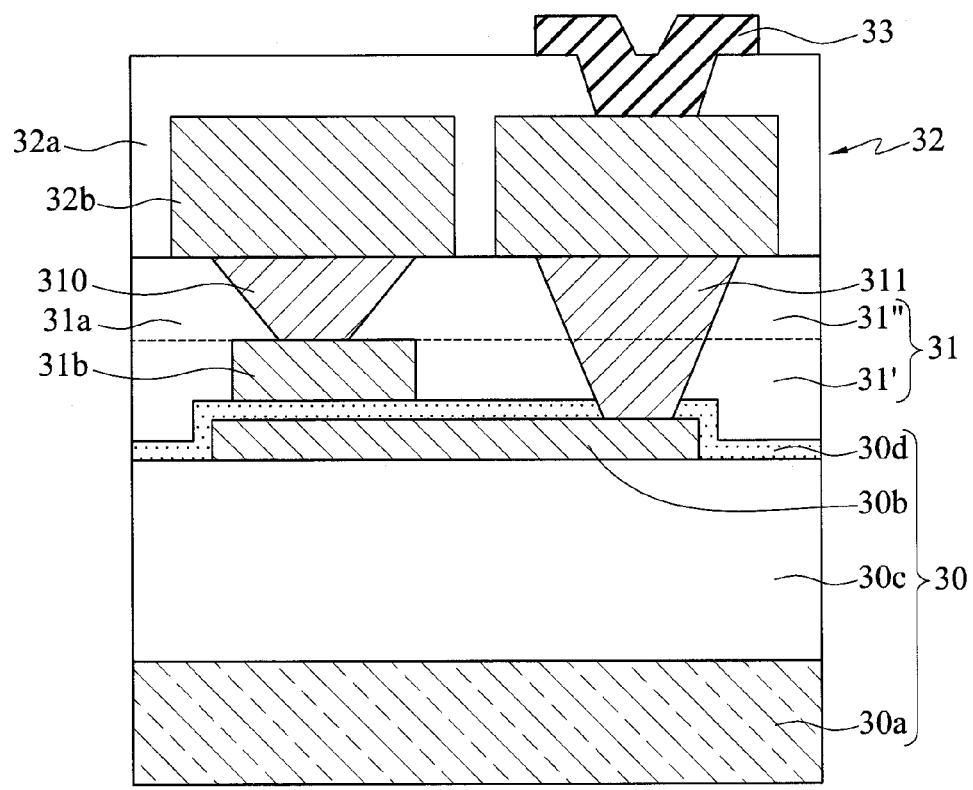

FIGS. 3A to 3D are circuit layout diagrams showing a fabrication method of a circuit structure of a duplexer 3, and FIG. 3D' is a partially cross-sectional view of the layout of FIG. 3D.

Referring to FIGS. 3A to 3D', a silicon wafer 30a is provided, and a dielectric material 30c made of such as polybenzobisoxazole (PBO) is formed on the silicon wafer 30a by coating. Then, a plurality of electrodes 30b are formed on the dielectric material 30c through an optical lithographic process. Thereafter, a passivation layer 30d made of such as silicon nitride is formed on the dielectric material 30c and the electrodes 30b through a chemical vapor deposition (CVD) process and portions of the electrodes 30b are exposed from the passivation layer 30d. As such, a substrate 30 is formed.

In the present embodiment, the electrodes 30b are made of copper and include a main capacitor electrode 300 and first, second, third, fourth, fifth, and sixth capacitor electrodes from 301 to 306. Further, the first and fourth capacitor electrodes 301, 304 are connected to each other.

Referring to FIGS. 3B, 3B' and 3D', a first circuit layer 31 is formed on the substrate 30. The first circuit layer 31 consists of a dielectric material 31a made of such as PBO and a first patterned circuit 31b. The first patterned circuit 31b is formed on the passivation layer 30d and includes a main capacitor 200, a first, a second, a third, a fourth, a fifth, and a sixth capacitors from C1 to C6, a second inductor L2 and a first half inductor a.

In the present embodiment, the second inductor L2 is connected in parallel with the second capacitor C2 so as to form a second resonant circuit 22. The electrodes 30b correspond to the main capacitor 200 and the first, second, third, fourth, fifth, and sixth capacitors from C1 to C6, respectively. That is, the main capacitor electrode 300 corresponds to the main capacitor 200, and the first, second, third, fourth, fifth, and sixth capacitor electrodes from 301 to 306 correspond to the first, second, third, fourth, fifth, and sixth capacitors from C1 to C6, respectively.

Then, a plurality of conductive vias 310 (dashed rectangular areas of FIGS. 3B and 3B') are formed in the dielectric material 31a of the first circuit layer 31, and a plurality of conductive through holes 311 (dashed circular areas of FIGS. 3B and 3B') are formed to penetrate the substrate 30 and the first circuit layer 31.

In the present embodiment, the conductive vias 310 are electrically connected to the main capacitor 200, the first capacitor C1, the third capacitor C3, the fourth capacitor C4, the first half inductor a, the fifth capacitor C5 and the sixth capacitor C6, respectively.

Further, the conductive through holes 311 are electrically connected to the portions of the electrodes 30b exposed from the passivation layer 30d. That is, the conductive through holes 311 are electrically connected to the first capacitor electrode 301, the third capacitor electrode 303, the fourth capacitor electrode 304, and the fifth capacitor electrode 305, respectively.

The main capacitor 200 consists of two capacitors 201, 202 connected in series. In particular, each of the two capacitors 201, 202 has a capacitance of 2 C and therefore the main capacitor 200 has a capacitance of C, i.e., ½c+½c=1/c.

In practice, two stacking layers 31', 31" can be fabricated so as to facilitate fabrication of the first patterned circuit 31b, the conductive vias 310 and the conductive through holes 311, thereby forming the first circuit layer 31.

Referring to FIGS. 3C and 3D', a second circuit layer 32 is formed on the first circuit layer 31. The second circuit layer 32 consists of a dielectric material 32a made of such as PBO and a second patterned circuit 32b.

The second patterned circuit 32b has: a first inductor L1 connected in parallel with the first capacitor C1 through the corresponding conductive via 310 so as to form a first resonant circuit 21; a third inductor L3 connected in parallel with the third capacitor C3 through the corresponding conductive via 310 so as to form a third resonant circuit 23; a fourth inductor L4 connected in parallel with the fourth capacitor C4 through the corresponding conductive via 310 so as to form a fourth resonant circuit 24; a second half inductor b connected in series with the first half inductor a through the corresponding conductive via 310 so as to form a fifth inductor L5; and a sixth inductor L6 connected in parallel with the sixth capacitor C6 through the corresponding conductive via 310 so as to form a sixth resonant circuit 26; a first signal port 27 electrically connected to the first resonant circuit 21 (or the first inductor L1); a second signal port 28a electrically connected to the third resonant circuit 23 (or the third inductor L3); a third signal port 28b electrically connected to the sixth resonant circuit 26 (or the sixth inductor L6); and a plurality of ground ports 29 connected to the third, fourth, and fifth resonant circuits 23, 24, 25 (or the third to fifth inductors from L3 to L5), respectively.

The first, second, and third resonant circuits from 21 to 23 form a first filter 20a. The fifth inductor L5 is connected in parallel with the fifth capacitor C5 through the corresponding conductive via 310 so as to form a fifth resonant circuit 25, and the fourth, fifth, and sixth resonant circuits from 24 to 26 form a second filter 20b.

In the present embodiment, referring to FIG. 3C, the first inductor L1 is in mutual induction with the second and third inductors L2, L3, respectively, and the third inductor L3 is in mutual induction with the second inductor L2. Further, the second inductor L2 is larger in size than the first inductor L1 and the third inductor L3.

The conductive through holes 311 electrically connect the first capacitor electrode 301 to the first inductor L1, the third capacitor electrode 303 to the third inductor L3, the fourth capacitor electrode 304 to the fourth inductor L4, and the fifth capacitor electrode 305 to the second half inductor b of the fifth inductor L5, respectively.

The fourth resonant circuit 24 is connected in series with the first resonant circuit 21. The fifth inductor L5 and the fourth inductor L4 are mutually inductive. The sixth resonant circuit 26, the main capacitor 220 and the fifth resonant circuit 25 are connected in series.

The main capacitor 200 consists of two capacitors 201, 202 connected in series. The capacitor 201 is connected in series with the fifth resonant circuit 25, and the capacitor 202 is connected in series with the sixth resonant circuit 26. Each of the first and second half inductors a, b has an inductance of ½L, and therefore the fifth inductor L5 has an inductance of L, i.e., ½L+½L=L.

Referring to FIGS. 3D and 3D', a plurality of openings of the dielectric material 32a are formed in the second circuit layer 32 such that the first signal port 27, the second signal port 28a, the third signal port 28b and the ground ports 29 are exposed from the openings to serve as conductive pads. Further, a UBM (under bump metallurgy) layer 33 is formed on the conductive pads and a plurality of conductive bumps 34 are formed on the UBM layer 33 for connecting with other electronic elements (not shown).

The layout of the main elements of the duplexer 3 is shown as in the following table or in FIG. 3C'.

|  | First filter | | | Second filter | | |
| --- | --- | --- | --- | --- | --- | --- |
|  | 23 | 22 | 21 | 24 | 25 | 26 |
| Second circuit layer | L3 |  | L1 | L4 | b |  L6 |
| First circuit layer | C3 | C2ˋL2 | C1 | C4 | C5ˋa | Main capacitor C6 |
| Substrate | Electrodes corresponding to the capacitors | | | | | |

By using IPD (Integrated Passive Device) stacking technology, passive elements such as capacitors and inductors can be formed in different circuit layers of a stacked circuit structure. Further, mutual induction occurs when two inductors are placed close to each other.

Therefore, through the design of mutual induction of the duplexer 3, the invention dispenses with the conventional electrical matching networks and eliminates the need to form the first, second, third, fourth, fifth, and sixth resonant circuits form 21 to 26 and the main capacitor 200 on a same circuit layer, thereby reducing the surface area of the dielectric materials 30c, 31a, 32a occupied by the circuit structure of the duplexer 3 and reducing the size of the semiconductor element so as to meet the miniaturization requirement of electronic products.

Further, through the design of mutual induction, the invention dispenses with the conventional main inductor, thus reducing the cost, the circuit layout area and the size of the semiconductor element and meeting the miniaturization requirement of electronic products.

Figure 7:
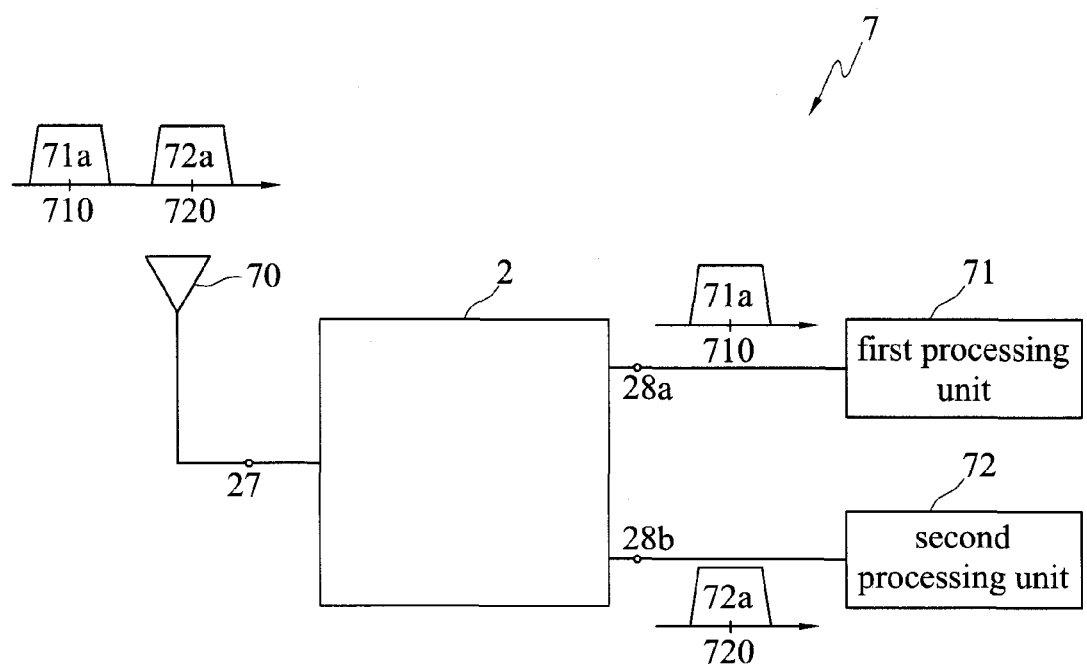
FIG. 7 is a schematic circuit diagram of an RF (radio frequency) transceiver apparatus of the present invention.

FIG. 7 shows an RF (radio frequency) transceiver apparatus 7 having the duplexer 2. The RF transceiver apparatus 7 is used in a wireless communication system for transmitting and receiving a first band signal 710 corresponding to a first center frequency 71a and a second band signal 720 corresponding to a second center frequency 72a.

The wireless communication system is a wireless access point, a wireless router, a wireless network card, a third generation (3G) wireless communication system or a fourth generation (4G) wireless communication system.

The RF transceiver apparatus 7 has: an antenna 70, a first processing unit 71, a second processing unit 72 and the duplexer 2.

The antenna 70 is used for transmitting and receiving the first and second band signals 710, 720.

The first processing unit 71 is used for processing the first band signal 710.

The second processing unit 72 is used for processing the second band signal 720.

The duplexer 2 is as shown in FIG. 2. The first signal port 27 is electrically connected to the antenna 70. The second signal port 28a is electrically connected to the first processing unit 71. The third signal port 28b is electrically connected to the second processing unit 72.

Figure 7A:
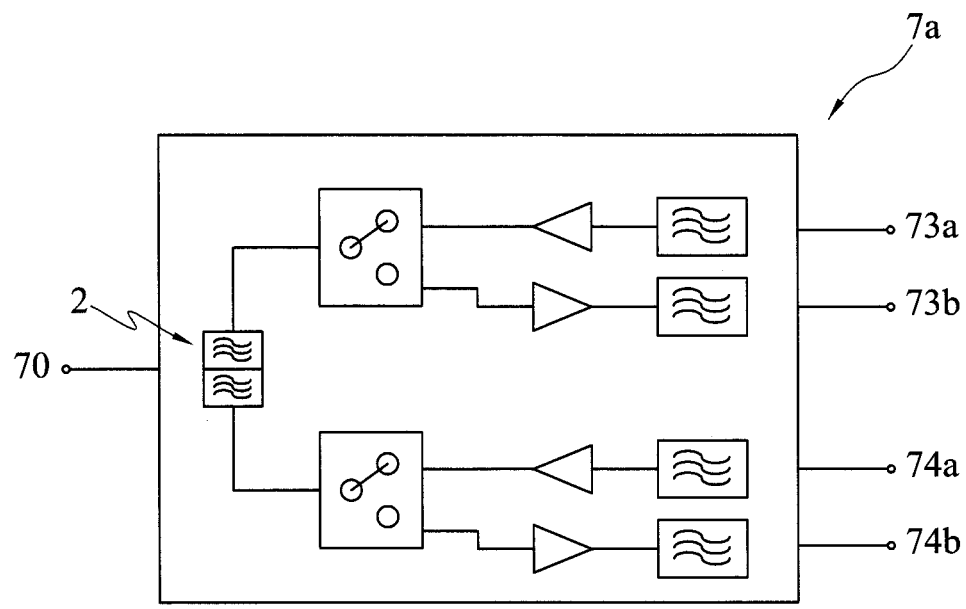
FIGS. 7A and 7B are schematic circuit diagrams illustrating different embodiments of the RF transceiver apparatus of FIG. 7.

Referring to FIG. 7A, the RF transceiver apparatus 7a has a single function. That is, each of the first, second, and third signal ports 27, 28a, 28b can only serve as an input port or an output port. Referring to FIG. 7A, the RF transceiver apparatus 7a has a first signal transmitting port 73a, a first signal receiving port 73b, a second signal transmitting port 74a and a second signal receiving port 74b, each of which is connected to the first and second processing units 71, 72.

Figure 7B:
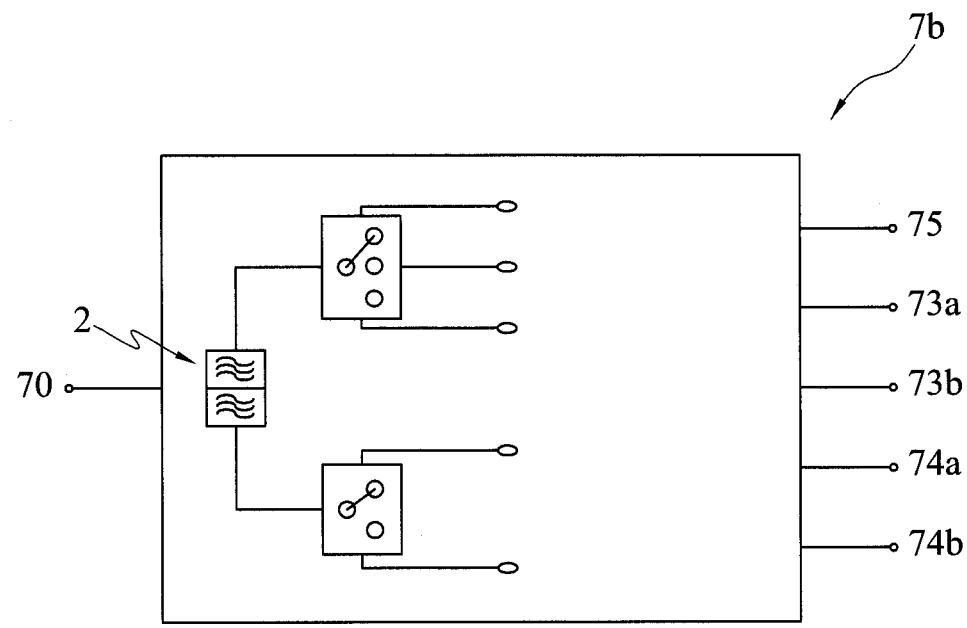

Referring to FIG. 7B, the RF transceiver apparatus 7b has dual functions. That is, each of the first signal port 27, the second signal port 28a and the third signal port 28b can be switched to serve as either an output port or an input port. The RF transceiver apparatus 7b has a first signal transmitting port 73a, a first signal receiving port 73b, a second signal transmitting port 74a, a second signal receiving port 74b and a Bluetooth port 75, each of which is connected to the first and second processing units 71, 72.

The first signal transmitting port 73a and the first signal receiving port 73b have a transmission frequency of 2.45 GHz. The second signal transmitting port 74a and the second signal receiving port 74b has a transmission frequency of 5.1 GHz.

The RF transceiver apparatus 7a, 7b can receive and transmit any two different frequencies that are not limited to the above-described frequencies of 2.45 GHz and 5.1 GHz.

Figure 8A:
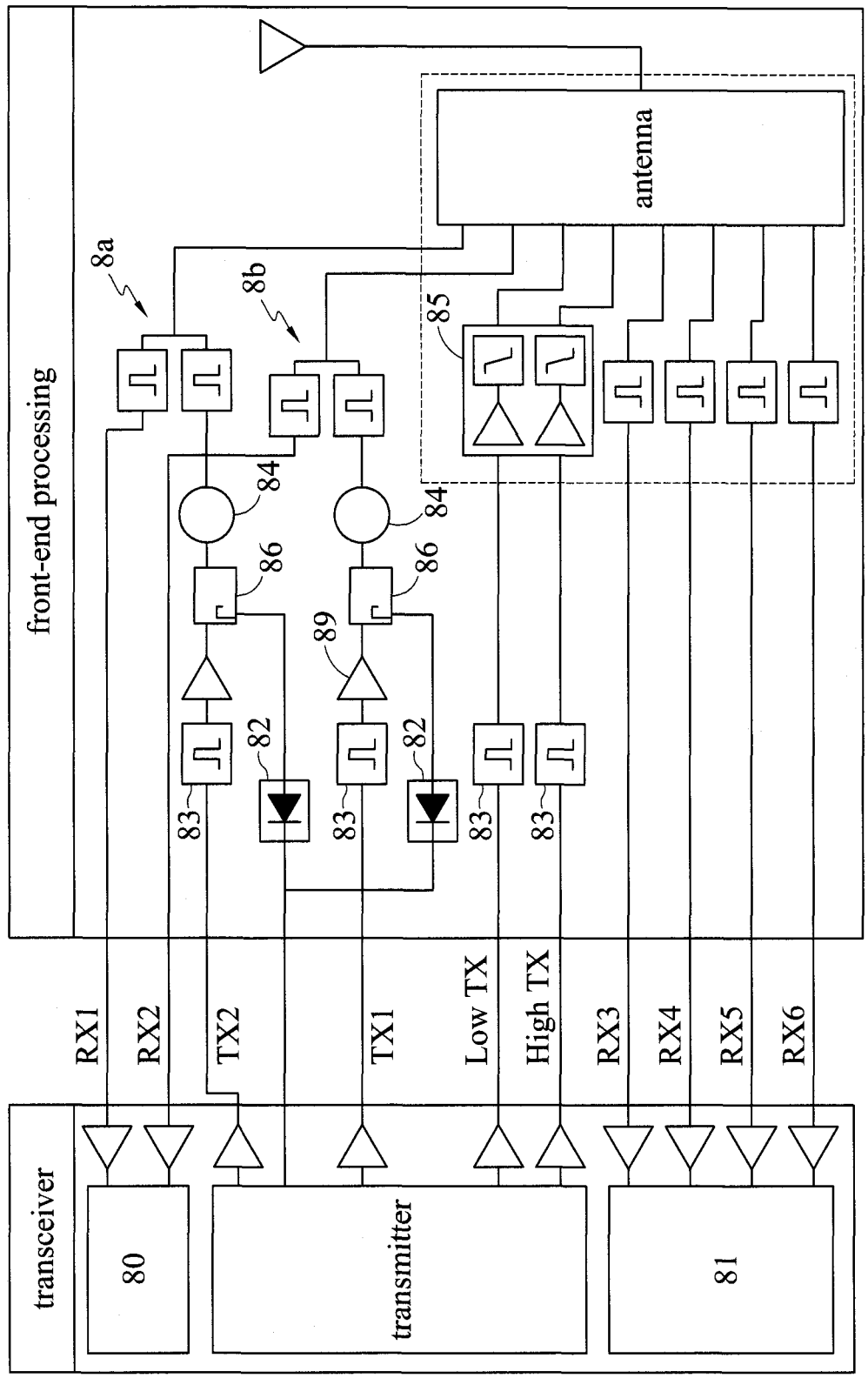
FIG. 8A is a schematic circuit diagram illustrating application of the RF transceiver apparatus in a third generation (3G) wireless communication system.

FIG. 8A is a schematic circuit diagram showing an application of the RF transceiver apparatus in a third generation (3G) wireless communication system.

The 3G system has: duplexers 8a, 8b, a UTMS (universal mobile telecommunications system) receiver 80, an EDGE (enhanced data rates for GSM evolution) GPRD (general packet radio device) receiver 81, detectors 82, band-pass filters 83, isolators 84, GSM (global system for mobile communications) 85, couplers 86 and power amplifiers 89. In FIG. 8A, the term "High TX" refers to high frequency band transmission. The term "Low TX" refers to low frequency band transmission.

Further, RX1 is electrically connected to TX1. RX2 is electrically connected to TX2. GSM 85 is electrically connected to High TX, Low TX, RX3, RX4, RX5 and RX6.

In FIG. 8A, the dashed box shows a front-end module.

Figure 8B:
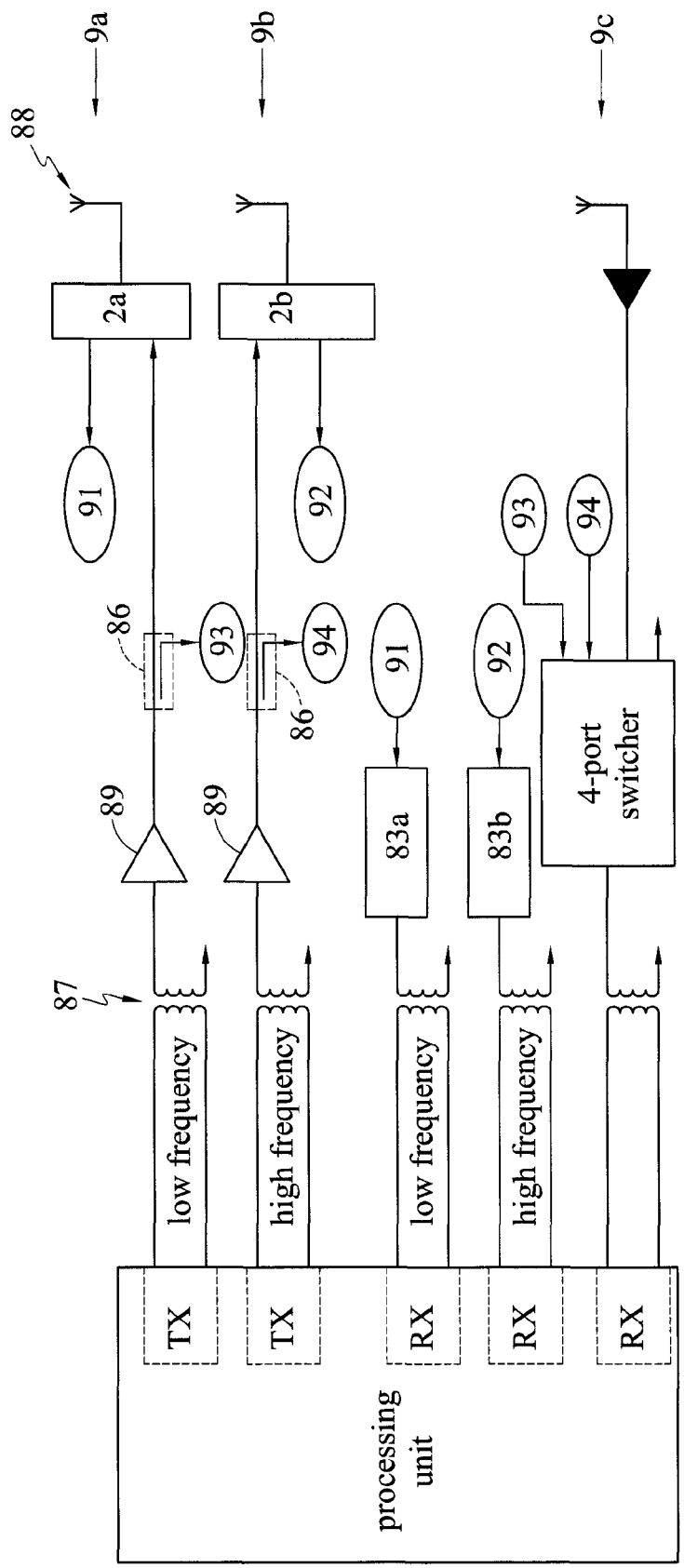
FIG. 8B is a schematic circuit diagram illustrating application of the RF transceiver apparatus in a fourth generation (4G) wireless communication system.

FIG. 8B is a schematic circuit diagram showing an application of the RF transceiver apparatus in a fourth generation (4G) wireless communication system. Therein, duplexers 2a, 2b are used.

The 4G system has a low frequency transmission system 9a, a high frequency transmission system 9b and a broadband transmission system 9c. The 4G system further has: band-pass filters 83a, 83b, couplers 86, BALUN transformers 87, antennas 88 and power amplifiers 89.

In FIG. 8A, for purposes of simplification, portions of the circuits are omitted. For example, two first transmission paths 91 are electrically connected to each other, two second transmission paths 92 are electrically connected to each other, two third transmission paths 93 are electrically connected to each other, and two fourth transmission paths 94 are electrically connected to each other.

Therefore, through the design of mutual induction and the use of IPD stacking technology, the present invention dispenses with the conventional electrical matching networks so as to reduce the size of the semiconductor element and improves the frequency discrimination capability.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A circuit structure of a duplexer, comprising:
   a first circuit layer, comprising:
      a main capacitor;
      a first, a second, a third, a fourth, a fifth and a sixth capacitor;
      a second inductor connected in parallel with the second capacitor to form a second resonant circuit; and
      a first half inductor; and
   a second circuit layer formed on the first circuit layer, the second circuit layer comprising:
      a first inductor connected in parallel with the first capacitor to form a first resonant circuit, wherein the first inductor and the second inductor are mutually inductive;
      a third inductor connected in parallel with the third capacitor to form a third resonant circuit, wherein the third inductor and the second inductor are mutually inductive, and the first, second and third resonant circuits form a first filter;
      a fourth inductor connected in parallel with the fourth capacitor to form a fourth resonant circuit, wherein the fourth resonant circuit is connected in series with the first resonant circuit;
      a second half inductor connected in series with the first half inductor such that the first half inductor and the second half inductor form a fifth inductor, wherein the fifth inductor is connected in parallel with the fifth capacitor to form a fifth resonant circuit, and the fifth inductor and the fourth inductor are mutually inductive;
      a sixth inductor connected in parallel with the sixth capacitor to form a sixth resonant circuit, wherein the sixth resonant circuit, the main capacitor, and the fifth resonant circuit are connected in series, and the fourth, fifth and sixth resonant circuits form a second filter;
      a first signal port electrically connected to the first resonant circuit;
      a second signal port electrically connected to the third resonant circuit; and
      a third signal port electrically connected to the sixth resonant circuit.

2. The circuit structure of claim 1, wherein the first inductor and the third inductor are mutually inductive.

3. The circuit structure of claim 1, wherein the second inductor is larger in size than the first inductor.

4. The circuit structure of claim 1, wherein the second inductor is larger in size than the third inductor.

5. The circuit structure of claim 1, wherein the main capacitor is made of two capacitors connected in series.

6. The circuit structure of claim 5, wherein one of the two capacitors is connected in series with the fifth resonant circuit and the other capacitor is connected in series with the sixth resonant circuit.

7. The circuit structure of claim 1, further comprising a plurality of conductive vias formed in the first circuit layer for electrically connecting the first inductor to the first capacitor, the third inductor to the third capacitor, the fourth inductor to the fourth capacitor, the first to second half inductors, the second half inductor to the fifth capacitor, and the sixth inductor to the sixth capacitor, respectively.

8. The circuit structure of claim 1, wherein the first signal port is an input port, and the second and third signal ports are output ports.

9. The circuit structure of claim 1, wherein the first signal port is an output port, and the second and third signal ports are input ports.

10. The circuit structure of claim 1, further comprising a plurality of ground ports connected to the third, fourth and fifth resonant circuits, respectively.

11. The circuit structure of claim 1, further comprising a substrate on which the first circuit layer is formed, wherein the substrate has a plurality of electrodes respectively corresponding to the main capacitor and the first, second, third, fourth, fifth and sixth capacitors.

12. The circuit structure of claim 11, further comprising a plurality of conductive through holes penetrating the substrate and the first circuit layer for electrically connecting the first inductor, the third inductor, the fourth inductor and the second half inductor to the corresponding electrodes, respectively.

13. A duplexer, comprising:
   a first signal port;
   a second signal port;
   a third signal port;

a first filter, comprising:
- a first resonant circuit directly connected to the first signal port and having a first inductor connected in parallel with a first capacitor;
- a second resonant circuit having a second inductor connected in parallel with a second capacitor, wherein the first inductor and the second inductor are mutually inductive; and
- a third resonant circuit electrically connected to the second signal port and having a third inductor connected in parallel with a third capacitor, wherein the third inductor and the second inductor are mutually inductive; and a second filter, comprising:
- a fourth resonant circuit directly connected in series with the first resonant circuit and having a fourth inductor connected in parallel with a fourth capacitor;
- a fifth resonant circuit having a fifth inductor connected in parallel with a fifth capacitor, wherein the fifth inductor and the fourth inductor are mutually inductive;
- a sixth resonant circuit electrically connected to the third signal port and having a sixth inductor connected in parallel with a sixth capacitor; and
- a main capacitor connected in series with the fifth resonant circuit and the sixth resonant circuit respectively and located therebetween.

14. The duplexer of claim 13, wherein the first inductor and the third inductor are mutually inductive.

15. The duplexer of claim 13, wherein the fifth inductor is a first half inductor connected in series with a second half inductor.

16. The duplexer of claim 13, wherein the main capacitor is comprised of two capacitors connected in series.

17. The duplexer of claim 16, wherein one of the two capacitors is connected in series with the fifth resonant circuit and the other capacitor is connected in series with the sixth resonant circuit.

18. The duplexer of claim 13, wherein the first signal port is an input port, and the second and third signal ports are output ports.

19. The duplexer of claim 13, wherein the first signal port is an output port, and the second and third signal ports are input ports.

20. The duplexer of claim 13, further comprising a plurality of ground ports connected to the third, fourth and fifth resonant circuits, respectively.

21. An RF (radio frequency) transceiver apparatus used in a wireless communication system for transmitting and receiving a first band signal corresponding to a first center frequency and a second band signal corresponding to a second center frequency, the apparatus comprising:
- an antenna for transmitting and receiving the first and second band signals;
- a first processing unit for processing the first band signal;
- a second processing unit for processing the second band signal; and
- the duplexer of claim 13, wherein the first signal port is electrically connected to the antenna, the second signal port is electrically connected to the first processing unit, and the third signal port is electrically connected to the second processing unit.

22. The apparatus of claim 21, wherein the first inductor and the third inductor are mutually inductive.

23. The apparatus of claim 21, wherein the fifth inductor is a first half inductor connected in series with a second half inductor.

24. The apparatus of claim 21, wherein the main capacitor is comprised of two capacitors connected in series.

25. The apparatus of claim 24, wherein one of the two capacitors is connected in series with the fifth resonant circuit and the other capacitor is connected in series with the sixth resonant circuit.

26. The apparatus of claim 21, wherein the first signal port is an input port, and the second and third signal ports are output ports.

27. The apparatus of claim 21, wherein the first signal port is an output port, and the second and third signal ports are input ports.

28. The apparatus of claim 21, further comprising a plurality of ground ports connected to the third, fourth, and fifth resonant circuits, respectively.

29. The apparatus of claim 21, wherein the wireless communication is a wireless access point, a wireless router, a wireless network card, a third generation (3G) wireless communication system or a fourth generation (4G) wireless communication system.

* * * * *